United States Patent
Fukumoto et al.

(10) Patent No.: US 7,528,442 B2
(45) Date of Patent: May 5, 2009

(54) SEMICONDUCTOR DEVICE AND MANUFACTURING METHOD THEREOF

(75) Inventors: Akira Fukumoto, Hirakata (JP); Rie Watanabe, Kyoto (JP)

(73) Assignee: Panasonic Corporation, Osaka (JP)

( * ) Notice: Subject to any disclaimer, the term of this patent is extended or adjusted under 35 U.S.C. 154(b) by 125 days.

(21) Appl. No.: 11/399,441

(22) Filed: Apr. 7, 2006

(65) Prior Publication Data

US 2006/0231916 A1    Oct. 19, 2006

(30) Foreign Application Priority Data

Apr. 13, 2005   (JP) ............... 2005-116276

(51) Int. Cl.
    *H01L 29/72*    (2006.01)
(52) U.S. Cl. ............... 257/336; 257/398; 257/399; 257/400; 257/408; 257/409; 257/506
(58) Field of Classification Search ............... 257/336, 257/398, 399, 400, 408, 409, 506
    See application file for complete search history.

(56) References Cited

U.S. PATENT DOCUMENTS 5,349,225 A * 9/1994 Redwine et al. ............. 257/336
5,830,790 A * 11/1998 Kim et al. ............. 438/227
2003/0119245 A1   6/2003 Iwamatsu et al.

FOREIGN PATENT DOCUMENTS

JP    08-130308    5/1996

OTHER PUBLICATIONS

Chinese Office Action issued in Chinese Patent Application No. CN 200610066615X, mailed Oct. 10, 2008.

* cited by examiner

*Primary Examiner*—Edward Wojciechowicz
(74) *Attorney, Agent, or Firm*—McDermott Will & Emery LLP

(57) ABSTRACT

In this invention, the semiconductor device is provided with a gate electrode formed on a gate insulating film in a region sectioned by an element isolation formed on a semiconductor layer of the first conduction type, and a source region and a drain region of the second conduction type. At least one of the source region and the drain region has a first low concentration region and a high concentration region. Also, the semiconductor device of the present invention is provided with a second low concentration region of the second conduction type between a channel stopper region formed below the element isolation and the source region, and between the channel stopper region and the drain region. The semiconductor layer immediately below the gate electrode projects to the channel stopper region side along the gate electrode, and the semiconductor layer and the channel stopper region make contact with each other.

18 Claims, 12 Drawing Sheets

SEMICONDUCTOR DEVICE AND MANUFACTURING METHOD THEREOF

BACKGROUND OF THE INVENTION

1. Field of the Invention

This invention relates to a semiconductor device and a manufacturing method thereof, and more specifically, a semiconductor device suitable for mixed mounting high-voltage MOS (Metal Oxide Semiconductor) transistors and low-voltage MOS transistors, and a manufacturing method thereof.

2. Description of the Related Art

In forming a plurality of MOS transistors on the same semiconductor substrate, an element isolation region made of an oxide film or the like is provided between neighboring transistors to insulate them from each other. Also, below the element isolation region is provided a channel stopper region comprising an impurity region of the same conduction type as a well region.

In terms of construction, if the channel stopper region is formed contacting a high-concentration impurity region comprising a source region or a drain region of an MOS transistor, when the transistor is in the operating state, a reverse bias is applied to a pn-junction formed in the contact section. That is to say, an electric field is concentrated in the pn-junction, and degradation of the reverse characteristic occurs such as a decrease in a breakdown voltage. Therefore, adopted in high-voltage MOS transistors is a structure wherein a specified interval (offset region) is provided between the channel stopper region and the high concentration impurity region so that they do not directly contact each other. However, if an offset region is immediately below the gate electrode, when an operation potential is applied to the gate electrode, a reverse layer is also formed in the region, causing a current leak to flow via the region between the source region and the drain region (hereafter referred to as a source-drain leak).

As a measure to prevent this, Japanese Patent No. 2800702 proposes an MOS transistor which adopts the offset structure described above and which can prevent a source-drain leak immediately below the gate electrode. FIGS. 11A to 11C are diagrams showing the structure of such a conventional n-channel MOS transistor. FIG. 11A is a plain layout diagram of an MOS transistor, and FIGS. 11B and 11C are cross-sectional views along the A-A line and the B-B line.

As shown in FIGS. 11A to 11C, the MOS transistor disclosed in Japanese Patent No. 2800702 is provided with a field oxide film 103 for element isolation at the surface portion of a p-type well region 102 (hereafter referred to as a p-well 102) formed on an n-type silicon substrate 101. Formed at the surface portion of the p-well 102 in a region sectioned by the field oxide film 103 are a source region and a drain region of an LDD (Lightly Doped Drain) structure in positions opposing each other across a gate electrode 105 formed on a gate oxide film 104. In this instance, the source region and the drain region are constructed of an n-type low concentration impurity region 106 (hereafter referred to as a low concentration region 106) and a high concentration impurity region 107 (hereafter referred to as a high concentration region 107).

A channel stopper region 108 comprising a p-type impurity region is also formed below the field oxide film 103. The channel stopper region 108 is placed via an offset region 109 in regions excluding that immediately below the gate electrode 105, owing to which the channel stopper region 108 never directly makes contact with the source region or the drain region.

On the other hand, immediately below the gate electrode 105 the channel stopper region 108 is formed projecting toward an element region 111, contacting a channel region 110 (see FIG. 11C). In this instance, it is desirable that the surface concentration of the channel stopper region 108 be lower than the surface concentration of the high concentration region 107 and higher than the surface concentration of the low concentration region 106.

According to such construction, because the channel stopper region 108 is provided with an offset region 109 provided relative to the high concentration region 107 and the low concentration region 106, and can obtain the effect of an offset structure described above. Because the channel stopper region 108 makes contact with the channel region 110 immediately below the gate electrode 105, no reverse layer occurs in regions adjoining the channel region 110, preventing the occurrence of a source-drain leak.

From the standpoint of realizing a high-voltage MOS transistor, as shown in the cross-sectional view in FIG. 12, an MOS transistor is provided (shown in FIG. 12 is an n-channel type) having a structure which has a field oxide film 120 at the channel ends in the gate length direction, and a field limiting region 121, formed below the field oxide film 120, comprising a impurity region with an opposite conduction type to the well region 102. With this structure, because the field limiting region 121 can limit the electric field concentrated at the channel ends of the drain region, an MOS transistor having a very high breakdown voltage can be realized.

SUMMARY OF THE INVENTION

In recent system LSIs, an amplifier circuit or the like constructed with high-voltage MOS transistors such as the above are formed on one semiconductor substrate together with a switching circuit such as a logic circuit or the like. In general, an MOS transistor comprising a switching circuit need not have high breakdown voltage but is required to have low power consumption. In such low power consumption MOS transistor (hereafter referred to as a low voltage MOS transistor), the smaller the structure is, the lower the consumed power becomes.

Along with recent progress in fine patterning, in fabricating such a low-voltage MOS transistor, shallow impurity diffusion layers and gate insulating films have been adopted, and also gate electrodes are formed with thinner polysilicon films in order to increase the fabricating accuracy of gate electrodes. Therefore, when the high-voltage MOS transistor shown in FIGS. 11A to 11C is formed simultaneously on the same substrate with a low-voltage MOS transistor, the following problems occur.

As a method of forming the low concentration region 106 and the high concentration region 107 of a conventional structure described above, phosphorus and arsenic are thermally diffused from a silicon substrate surface as impurities to different depths by utilizing the difference in the thermal diffusion coefficient between the phosphorus and the arsenic, by which high-temperature thermal processing is performed for the thermal diffusion.

However, when forming a high-voltage MOS transistor simultaneous with a low-voltage MOS transistor using this method, a shallow impurity diffusion layer of the low-voltage MOS transistor is deeply formed due to the influence of thermal processing, degrading the characteristics of the low-voltage MOS transistor. Conversely, if the temperature and time of thermal processing are restricted by conditions to form a shallow impurity diffusion layer of the low-voltage MOS transistor, the low concentration region 106 having enough width for high voltage operating cannot be formed around the high concentration region 107 of the high-voltage MOS transistor.

As another method of forming the low concentration region 106 and the high concentration region 107, utilizing the ion implantation method can be considered. In this case, the low concentration region 106 is formed by injecting low concentration impurity ions with high acceleration energy, and the high concentration region 107 is formed to be shallow by injecting high concentration impurity ions with low acceleration energy. In this time, the gate electrode 105 is used as a part of the mask for the ion implantation in order to form the low concentration region 106 and the high concentration region 107 aligned to the gate electrode 105 with very high precision.

As described above, along with finer patterning of low-voltage MOS transistors, thinner polysilicon films are used for the gate electrode 105. Therefore, if the acceleration energy is high, ions penetrate the gate electrode 105 comprising a mask and are injected to the channel region 110 immediately below the gate electrode 105, degrading the property of the high-voltage MOS transistor.

In order to prevent such property degradation, the low concentration region 106 and the high concentration region 107 must be formed with acceleration energy in which ions are not injected to the channel region 110 of the high-voltage MOS transistor. Especially, if the acceleration energy for forming the low concentration region 106 is restricted to an acceleration energy where the gate electrode 105 is not penetrated, the low concentration region 106 having enough width for high-voltage operating cannot be formed around the high concentration region 107 of the high-voltage MOS transistor. In this case, even if an offset structure is adopted, an electric field concentration occurs in the offset region 109, degrading the reverse characteristic.

On the other hand, there is a problem that, whereas high-voltage operating can be realized by the high-voltage MOS transistor shown in FIG. 12, the field oxide film 120 at the channel ends and the field limiting region 121 cannot be formed with fine structures, making miniaturization difficult.

The present invention has been proposed considering the conventional situation, and its objective is to provide a high-voltage semiconductor device which is compact and suitable for simultaneous formation of a low-voltage MOS transistor, and manufacturing method thereof.

The present invention employs the following means in order to accomplish the aforementioned object. First, the invention presumes a semiconductor device having a semiconductor layer of a first conduction type, a source region and a drain region of a second conduction type formed apart from each other by a specified interval at the surface portion of an element region sectioned by an element isolation film formed on the semiconductor layer, a gate electrode formed on a gate insulating film on the semiconductor layer between the source region and drain region, and a channel stopper region of the first conduction type formed below the element isolation film.

Then, the semiconductor device of the this invention, at least one of the source region and drain region is provided with a high concentration impurity region of the second conduction type and a first low concentration impurity region of the second conduction type provided around the high concentration impurity region. Also adopted is construction provided with a second low concentration impurity region of the second conduction type below the element isolation film between the channel stopper region and the first low concentration impurity region.

In this instance, it is desirable that the semiconductor layer immediately below the gate electrode be formed projecting to the channel stopper region side along the gate electrode, and that the semiconductor layer and channel stopper region are formed contacting each other. Alternatively, the channel stopper region immediately below the gate electrode may be formed projecting to the semiconductor layer side between the source region and the drain region along the gate electrode, and the channel stopper region and the semiconductor layer between the source region and the drain region may be formed contacting each other.

As the surface concentration of the first low concentration impurity region, the surface concentration of the second low concentration impurity region, and the surface concentration of the channel stopper region, arbitrary surface concentrations can be adopted if they are lower than the surface concentration of the high concentration impurity region.

In manufacturing the semiconductor device, the second low concentration impurity region and the channel stopper region are formed before forming the element isolation film.

On the other hand, in another view of the invention, it is possible to provide a manufacturing method of a semiconductor device having a first field-effect transistor and a second field-effect transistor which has a higher breakdown voltage than the first field-effect transistor on a semiconductor substrate. In this instance, at least one region of a source region and a drain region of the second field-effect transistor has a high concentration impurity region and a first low concentration impurity region provided around the high concentration impurity region.

The manufacturing method of the semiconductor device of the present invention is as follows. First, a channel stopper region of a first conduction type is formed in the outer circumference of the formation region of the second field-effect transistor, and a second low concentration impurity region of the second conduction type is formed in a region sectioned by the channel stopper region. Subsequently, an element isolation film is formed on the channel stopper region, the low concentration impurity region, and the outer circumference surface of the formation region of the first field-effect transistor.

Also, a common conductive film is formed in the first field-effect transistor formation region and the second field-effect transistor formation region, sectioned by the second low concentration impurity region, on gate insulating films corresponding to the respective transistors. A gate electrode of the first field-effect transistor and a gate electrode of the second field-effect transistor are formed by fabricating the conductive film.

Then, a source region of the second conduction type and a drain region of the second conduction type of the second field-effect transistor are formed in a region sectioned by the second low concentration impurity region, and the source region and the drain region of the first field-effect transistor are formed in the first field-effect transistor formation region.

According to the present invention, at least the drain region is provided with a high concentration impurity region and a first low concentration impurity region, and a second low concentration region is provided between the first low concentration impurity region and a channel stopper region. Therefore, even when the channel stopper region is formed with high concentration, degradation of the reverse characteristic of a pn-junction formed between the channel stopper region and the first low concentration impurity region can be suppressed.

At this time, the structure may become such that the channel stopper region projects to the channel region side along the gate electrode immediately under the gate electrode, and that the channel stopper region makes contact with the channel region. In this structure, no reverse layer is formed in the semiconductor layer adjoining the channel region, and it is possible to prevent the occurrence of a source-drain leak. Also, the structure can be made such that the channel region projects to the channel stopper region side along the gate electrode immediately under the gate electrode, so that the channel region makes contact with the channel stopper region.

According to the manufacturing method of the semiconductor device of the present invention, because formation of the channel stopper region and the second low concentration impurity region is performed before the formation of the element isolation film, the impurity concentration gradient between the second low concentration impurity region and the channel stopper region can be made to be moderate. Therefore, the concentration of an electric field at the pn-junction formed in the region can be suppressed, and the reverse characteristic of the pn-junction can be improved.

In addition, the high-voltage semiconductor device of the present invention can be formed, for example, simultaneously with a low-voltage field-effect transistor which has a shallow impurity region and/or a gate electrode comprising a thin conductive film. Therefore, a system LSI mixed mounting a high-voltage field-effect transistor and a low-voltage field-effect transistor can be constructed compactly.

The foregoing and other objects, features, aspects and advantages of the present invention will become more apparent from the following detailed description of the present invention when taken in conjunction with the accompanying drawings.

DETAILED DESCRIPTION OF PREFERRED EMBODIMENTS

Embodiment 1

Figure 1A:
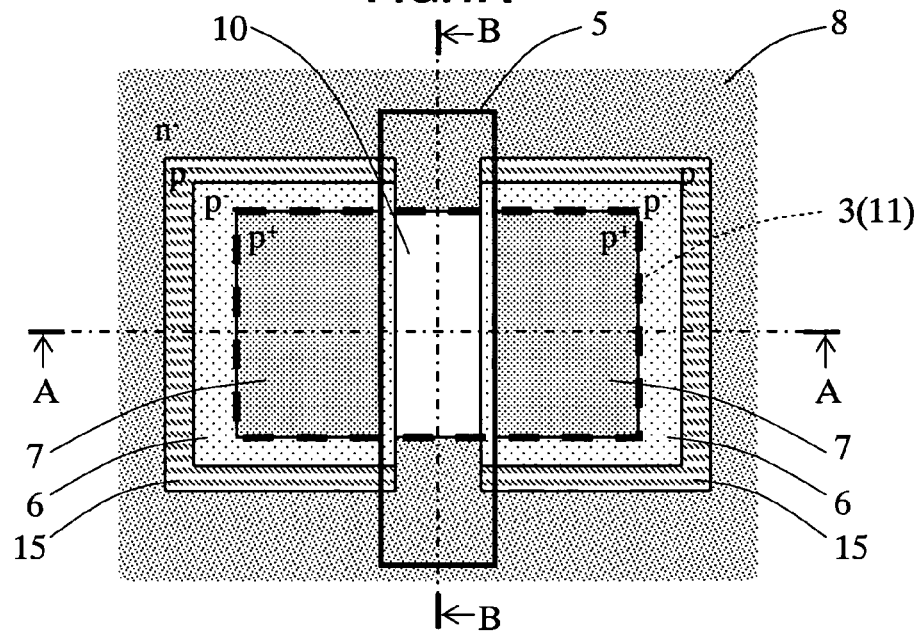
FIGS. 1A to 1C show a semiconductor device of the first embodiment of the present invention.
Figure 1B:
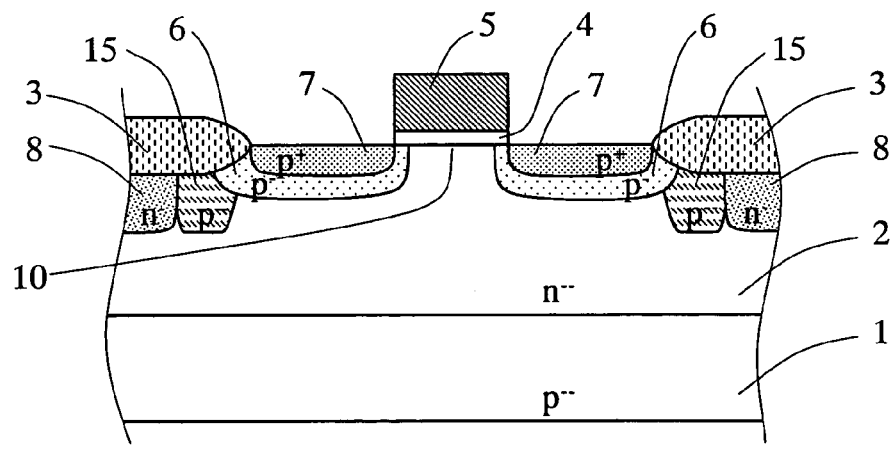
Figure 1C:
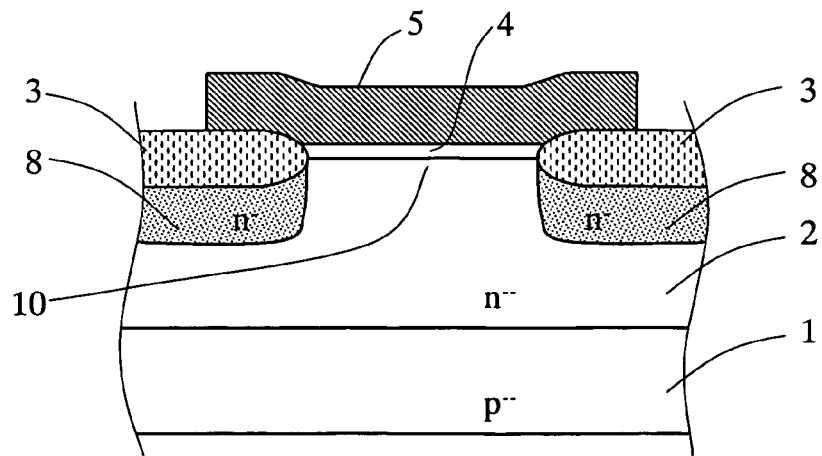
Figure 11A:
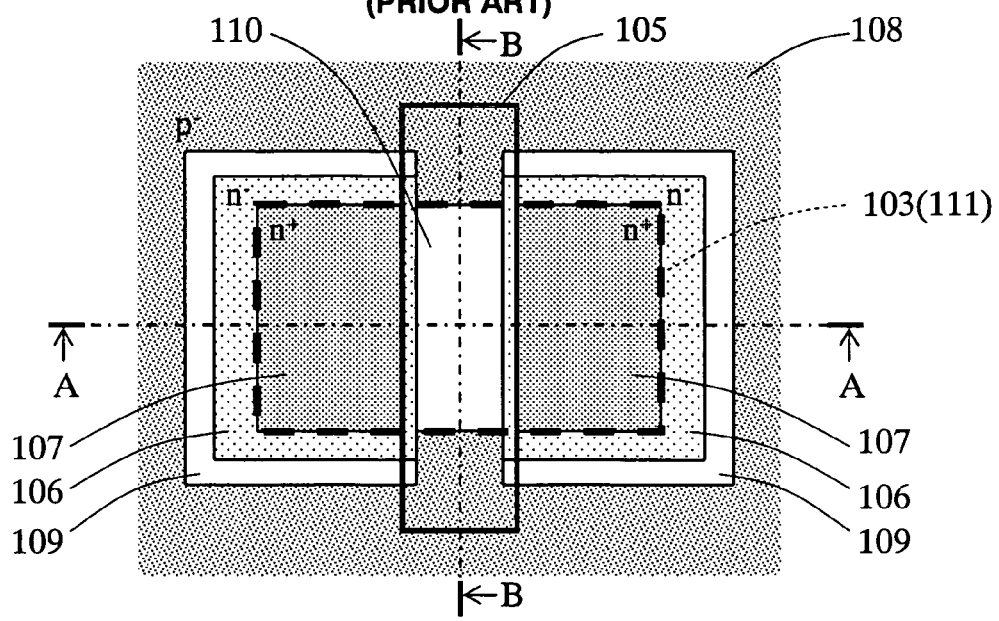
FIGS. 11A to 11C show a conventional semiconductor device.
Figure 11B:
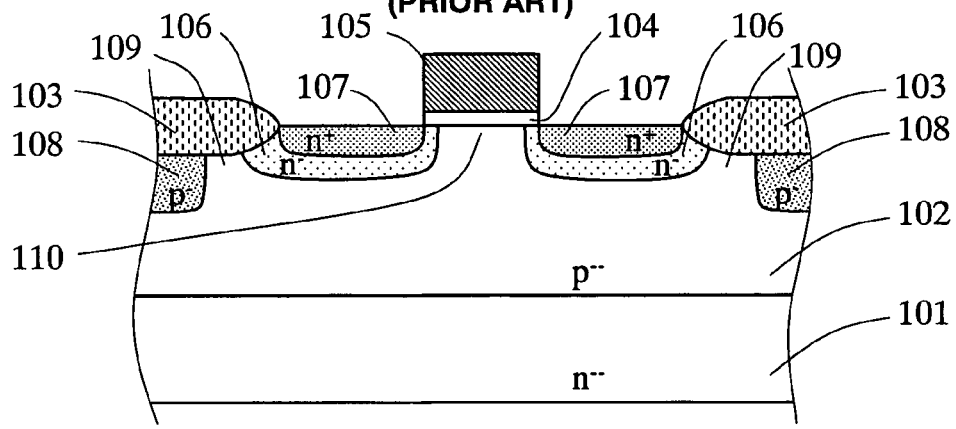
Figure 11C:
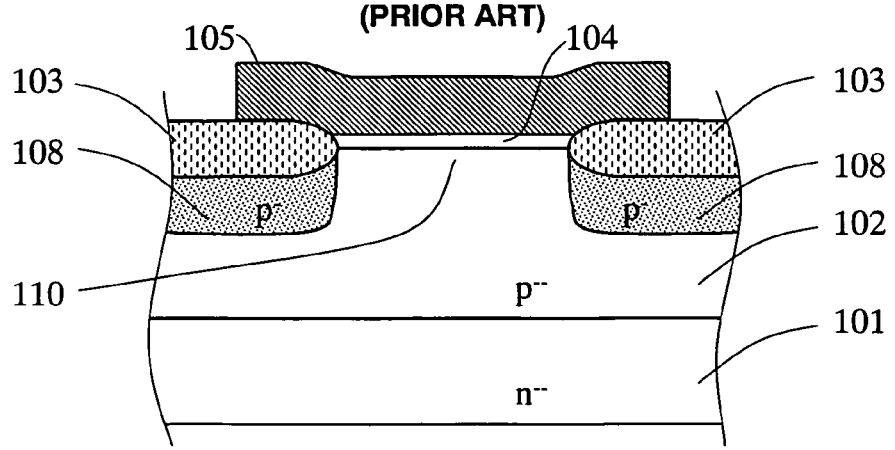
Figure 12:
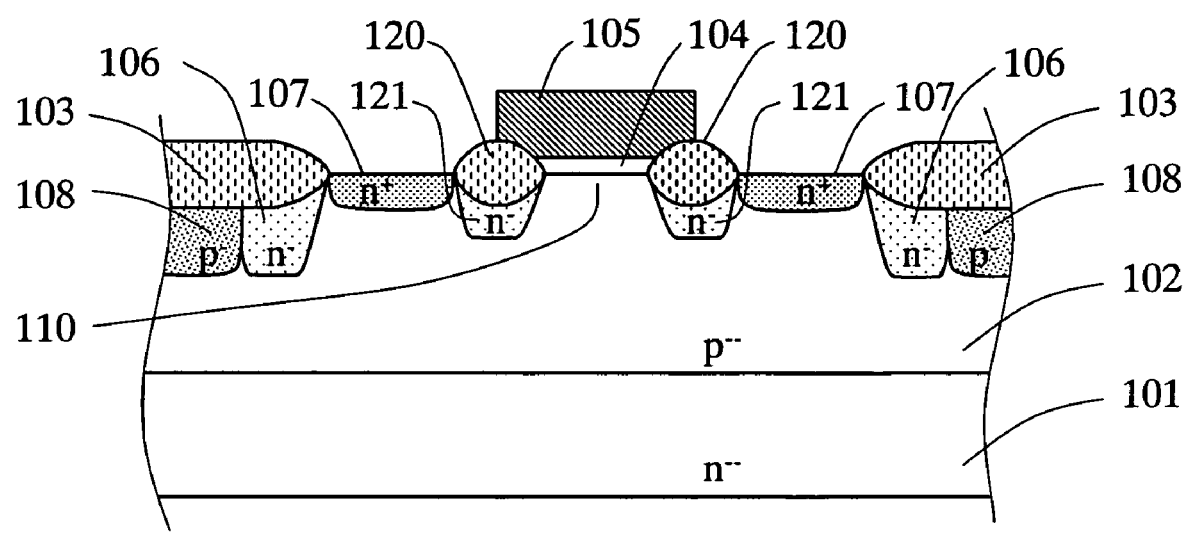
FIG. 12 is a cross-sectional view showing a conventional semiconductor device.

Below, a semiconductor device of an embodiment 1 of the present invention is explained in detail referring to drawings. FIG. 1A is a plane layout diagram of the semiconductor device of this embodiment, and FIGS. 1B and 1C are cross-sectional views at the A-A line and the B-B line shown in FIG. 1A, respectively. Also, FIGS. 2A to 2D and FIGS. 3A to 3D are process cross-sectional views showing the manufacturing processes of the semiconductor device shown in FIGS. 1A to 1C. In this instance, the process cross-sectional views shown in FIGS. 2A to 2D and FIGS. 3A to 3D correspond to the cross-sections at the A-A line shown in FIG. 1A. Further, FIGS. 4A to 4D are plane views corresponding to FIGS. 2A to 2D, and FIGS. 5A to 5D are plane views corresponding to FIGS. 3A to 3D. Note that in FIGS. 1A to 1C, 2A to 2D, 3A to 3D, 4A to 4D, and 5A to 5C, unlike the conventional semiconductor device explained in FIGS. 11A to 11C, a p-channel MOS transistor is shown as an example. In addition, in FIG. 1A the field oxide film 3 is shown only with its external shape, where the edge of the field oxide film 3 is shown by the broken line. In the same way, in FIG. 1A the gate electrode 5 is shown only with its external shape in a thick line.

As shown in FIGS. 1A to 1C, the semiconductor device of this embodiment is provided with a field oxide film 3, which is an element isolation film, at the surface portion of an n-type well region 2 (hereafter referred to as a n-well 2) formed on a p-type silicon substrate 1. On the surface portion of the n-well 2 in region 11 sectioned by the field oxide film 3 (the region inside the broken line in FIG. 1A, hereafter referred to as element region 11), p-type low concentration impurity regions 6 (first low concentration impurity regions) are formed in positions opposing each other across a gate electrode 5 formed on a gate oxide film 4. Then, p-type high concentration impurity regions 7 are formed on the surface portion of the low concentration impurity regions 6. The low concentration impurity regions 6 and high concentration impurity regions 7 function as the source region and the drain region in an LDD (Lightly Doped Drain) structure. The low concentration impurity regions 6 are referred to as low concentration regions 6, and the high concentration impurity regions 7 are referred to as high concentration regions 7.

On the other hand, a channel stopper region 8 comprising an n-type impurity region is formed below the field oxide film 3. As shown in FIGS. 1A and 1C, in the region immediately below the gate electrode 5, the channel stopper region 8 is formed projecting toward the element region 11, contacting the channel region 10 between the source region and the drain region. Then, in the semiconductor device of this embodiment, an isolation-side low concentration impurity region 15 (second low concentration impurity region) is provided between the low concentration region 6 and the channel stopper region 8.

In this instance, as the surface concentration of the low concentration region 6, the surface concentration of the isolation-side low concentration impurity region 15, and the surface concentration of the channel stopper region 8, arbitrary surface concentrations can be adopted if they are lower than the surface concentration of the high concentration region 7. The isolation-side low concentration impurity region 15 is referred to as the isolation-side low concentration region 15.

A more detailed structure of the semiconductor device of this embodiment is explained hereafter along with manufacturing process thereof.

Figure 2A:
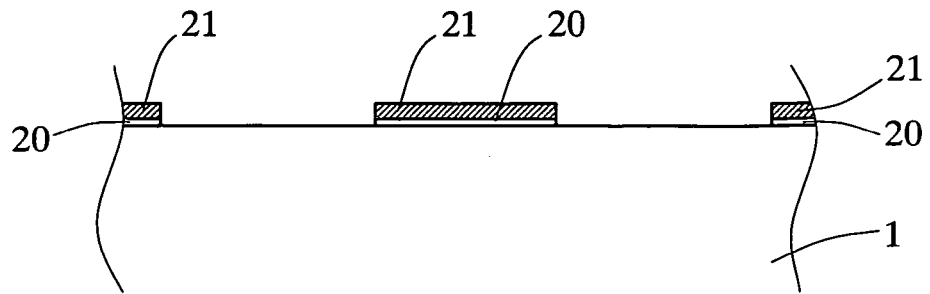
FIGS. 2A to 2D are cross-sectional views showing the manufacturing process of a semiconductor device of the first embodiment of the present invention.
Figure 4A:
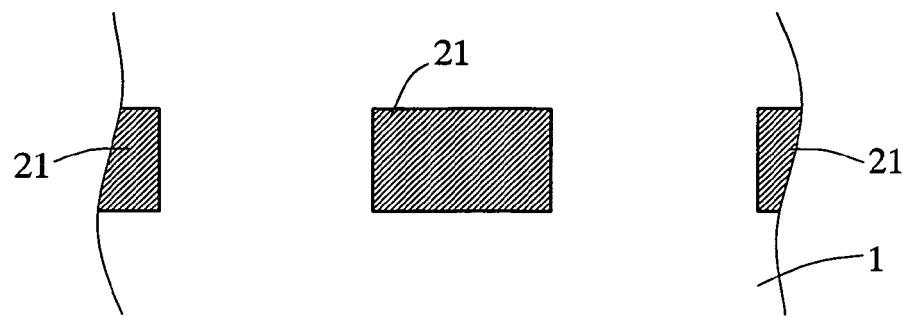
FIGS. 4A to 4D are plane views showing the manufacturing process of a semiconductor device of the first embodiment of the present invention.

First, on a p-type silicon substrate 1 with boron doped by about 1E15 to 1E16 cm$^{-3}$, a silicon oxide film 20 of 5 to 30 nm thick is formed by the thermal oxidization method or the like. Also, on the silicon oxide film 20 a silicon nitride film 21 of 50 to 200 nm thick is made by such as the CVD (Chemical Vapor Deposition) method. Then, as shown in FIG. 2A and FIG. 4A, by applying the publicly-known photolithography and etching techniques, a pattern to coat an element region 11 (shown by the broken line in FIG. 1A) is formed of a multilayer film of the silicon oxide film 20 and the silicon nitride film 21.

Figure 2B:
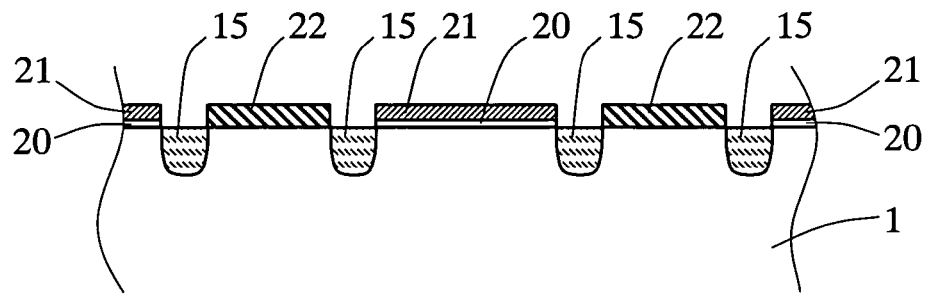
Figure 4B:
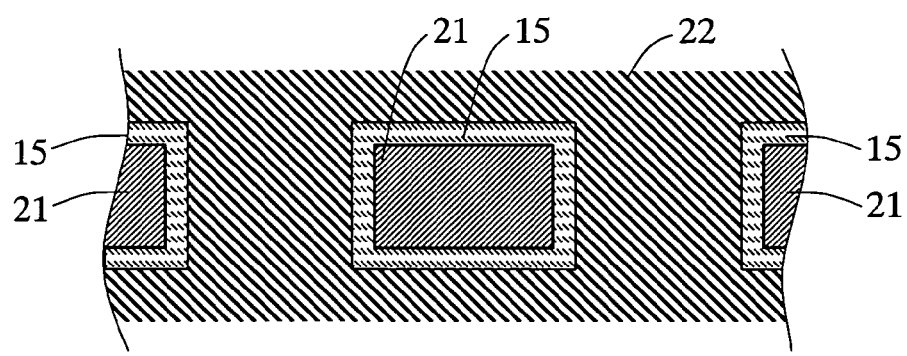

Next, as shown in FIG. 2B and FIG. 4B, on the silicon substrate 1 a resist pattern 22 coating only the formation position of the channel stopper region 8 is formed by photolithography. Then, with the resist pattern 22 and silicon nitride film 21 (and silicon oxide film 20) as masks, boron is injected by the ion implantation into the silicon substrate 1 with a dose amount of 1E13 to 1E14 cm$^{-2}$, forming a p-type isolation-side low concentration region 15 having a surface concentration of 5E16 to 3E17 cm$^{-3}$ and a depth of about 0.5 to 1.0 microns. At this time, if the acceleration energy of boron is set to about 15 to 30 keV, boron is not injected to the element region 11 coated with the silicon nitride film 21.

Figure 2C:
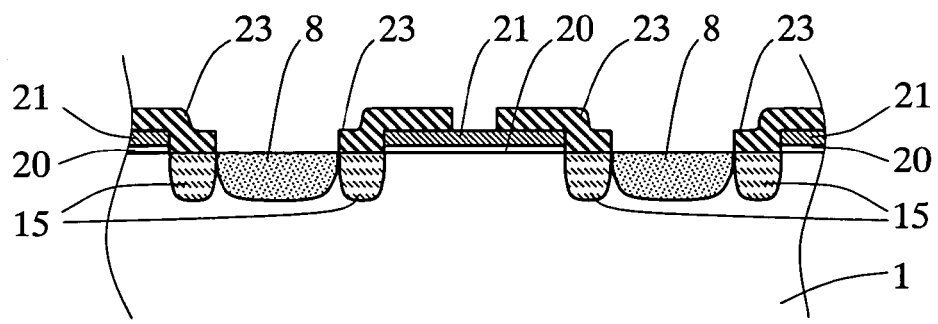
Figure 4C:
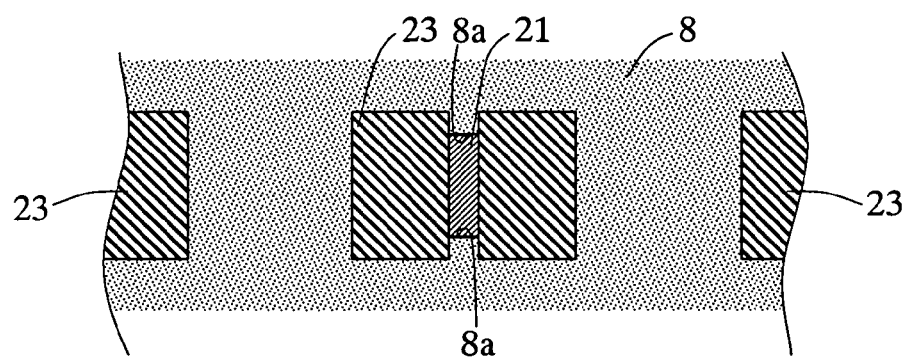

Subsequently, on the silicon substrate 1 removed the resist pattern 22, a resist pattern 23 having an opening at the formation position of the channel stopper region 8 is formed by photolithography. In this instance, as shown in FIG. 2C and FIG. 4C, the resist pattern 23 is not formed in the region corresponding to the formation position of the gate electrode 5 formed in the following, exposing the silicon nitride film 21.

Then, using the resist pattern 23 and the silicon nitride film 21 (and the silicon oxide film 20) as masks, phosphorus is injected by the ion implantation into the silicon substrate 1 with a dose amount of about 5E12 to 5E13 cm$^{-2}$, forming an n-type channel stopper region 8 having a surface concentration of 1E17 to 5E17 cm$^{-3}$ and a depth of about 0.5 to 1.0 microns. At this time, if the acceleration energy of phosphorus is set to about 50 to 100 keV, phosphorus is not injected to the region coated with the silicon nitride film 21.

Figure 2D:
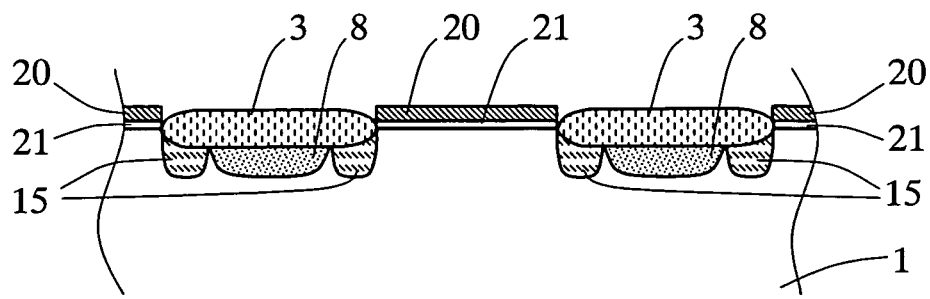
Figure 4D:
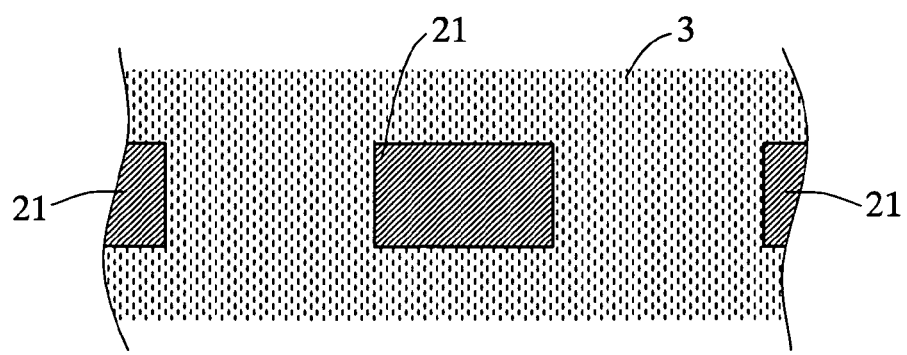

After the resist pattern 23 is removed, as shown in FIG. 2D and FIG. 4D, thermal processing to heat the substrate temperature of the silicon substrate 1 to about 1000° C. in a water vapor atmosphere is performed for 60 to 120 minutes, by which a field oxide film 3 of 300 to 700 nm thick is formed on the region where the silicon substrate 1 is exposed (non-formation region of the silicon nitride film 21). At this time, in the region corresponding to immediately below the gate electrode 5 formed in the following, the field oxide film 3 is formed to be self-aligned to the tip 8a (see FIG. 4C) of the projecting section of the channel stopper region 8.

Figure 3A:
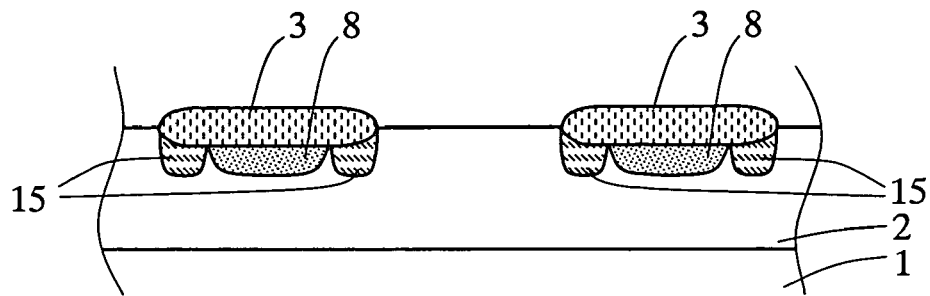
FIGS. 3A to 3D are cross-sectional views showing the manufacturing process of a semiconductor device of the first embodiment of the present invention.
Figure 5A:
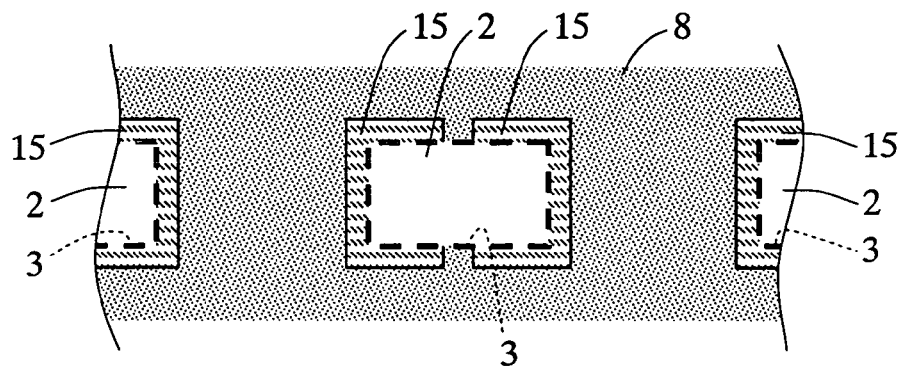
FIGS. 5A to 5D are plane views showing the manufacturing process of a semiconductor device of the first embodiment of the present invention.

Subsequently, after the silicon nitride film 21 and the silicon oxide film 20 are successively removed by etching, phosphorus is injected by the ion implantation over the entire surface of the silicon substrate 1, forming the n-well 2 having a surface concentration of 1E16 to 5E16 cm$^{-3}$ and a depth of 1.5 to 3.0 microns as shown in FIG. 3A and FIG. 5A.

Figure 3B:
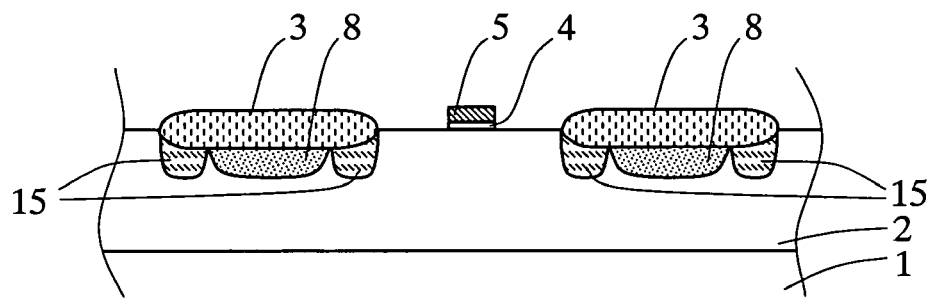
Figure 5B:
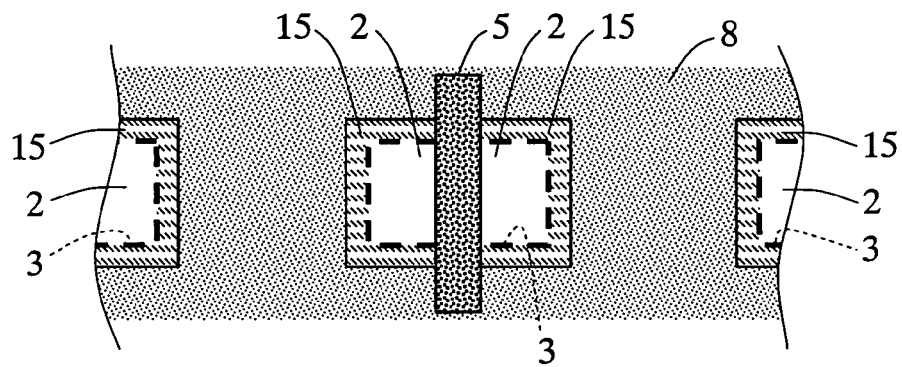

Further, as shown in FIG. 3B and FIG. 5B, gate oxide film 4 having of about 30 to 60 nm in thickness is formed over the entire surface of the silicon substrate 1, and polysilicon film doped with phosphorus to about 1E19 to 9E19 cm$^{-3}$ is formed with a film thickness of about 0.2 to 0.5 microns on the gate oxide film 4 by the CVD method. Then, photolithography and etching are performed on the polysilicon film to form the pattern of the gate electrode 5. In this embodiment, the gate length of the gate electrode 5 is fabricated to about 1.5 to 3.0 microns.

After the fabrication of the gate electrode 5 is complete, boron is injected by the ion implantation into the silicon substrate 1 with an acceleration energy of 40 to 80 keV and a dose amount of 5E12 to 5E13 cm$^{-2}$ with the gate electrode 5 and the field oxide film 3 as masks, forming the p-type low concentration region 6 having a surface concentration of 1E18 to 1E19 cm$^{-3}$ and a depth of about 0.3 to 0.6 microns. This ion implantation is performed with the silicon substrate 1 tilted by 20 to 45 degrees relative to a perpendicular direction to the ion incidence direction under a continuous rotation or step rotation (for example, 90 degree rotation×4 steps). In this instance, the low concentration region 6 is formed in a state advancing to beneath the gate electrode 5 and the field oxide film 3.

Subsequently, boron fluoride (BF$_2$) is injected by the ion implantation into the silicon substrate 1 with an acceleration energy of 20 to 40 keV and a dose amount of 3E15 to 8E15 cm$^{-2}$ with the gate electrode 5 and the field oxide film 3 as masks, forming the p-type high concentration region 7 having a surface concentration of 1E20 cm$^{-3}$ or higher and a depth of about 0.2 to 0.3 microns. In this instance, because the acceleration energy of boron fluoride is set to about 20 to 40 keV, boron fluoride is not injected to the channel region 10 coated with the gate electrode 5, and the high concentration region 7 is formed self-aligned to the gate electrode 5.

Subsequently, a source electrode and a drain electrode made of a metal comprising an ohmic contact are formed on the high concentration region 7, completing a p-channel MOS transistor shown in FIG. 1A to 1C. Because the following processes are the same as in the manufacturing method of publicly-known semiconductor devices, their explanations are omitted.

According to the manufacturing method explained above, even when a MOS transistor (hereafter referred to as a high-voltage MOS transistor) formed by the manufacturing method is mounted mixed with a low-voltage MOS transistor having a fine logic circuit or the like, a high-voltage MOS transistor can be formed using a thin gate electrode 5 required by the low-voltage MOS transistor.

In mounting the high-voltage MOS transistor and the low-voltage MOS transistor mixed, in the manufacturing process, the formation region of the low-voltage MOS transistor is coated with the silicon oxide film 20 and the silicon nitride film 21 until the completion of forming the field oxide film 3 (FIG. 2D and FIG. 4D). Then, around the time of forming the n-well 2 of the high-voltage MOS transistor (FIG. 3A and FIG. 5A), a well region is formed upon necessity.

Subsequently, after forming the gate oxide film 4 of the high-voltage MOS transistor, the gate oxide film 4 in the formation region of the low-voltage MOS transistor is removed by etching, and a thin oxide film becomes a gate insulating film for the low-voltage MOS transistor. Then, a polysilicon film comprising a conductive film is formed over the entire surface of the silicon wafer 1, and the gate electrodes for the low-voltage MOS transistor and the high-voltage MOS transistor are formed by fabricating the common conductive film (FIG. 3B and FIG. 5B).

Also, during the formation process of the source region and the drain region of the high-voltage MOS transistor (FIG. 3C, FIG. 3D, FIG. 5C, and FIG. 5D), the formation region of the low-voltage MOS transistor is coated with a resist.

Then, the source region and the drain region of the low-voltage MOS transistor are formed by the ion implantation or the like, after completing the fabrication of the gate electrode and before starting (FIG. 3C and FIG. 5C) or after completing (FIG. 3D and FIG. 5D) the formation the source region and the drain region of the high-voltage MOS transistor. In the formation process of the source region and the drain region of the low-voltage MOS transistor, the formation region of the high-voltage MOS transistor is coated with a resist. In this case, while the channel stopper region 8 and the isolation-side low concentration region 15 below the field oxide film 3 which sections the formation region of the low-voltage MOS transistor are unnecessary, they may be formed appropriately when the formation is necessary in cases in which it adjoins a high-voltage MOS transistor.

Also, when the source region and the drain region of the low-voltage MOS transistor have an LDD structure, the high concentration region of the LDD structure of the low-voltage MOS transistor and the high concentration regions 7 in the source region and the drain region of the high-voltage MOS transistor may also be formed simultaneously. In this case, the low concentration regions in the source region and the drain region of the low-voltage MOS transistor are formed after completing the fabrication of the gate electrode and before starting (FIG. 3C and FIG. 5C) the formation of the low concentration regions 6 in the source region and the drain region of the high-voltage MOS transistor or after completing the formation of the low concentration regions 6. Then, the high concentration regions in the source region and the drain region for the low-voltage MOS transistor are formed in the formation process of the high concentration regions 7 in the source region and the drain region of the high-voltage MOS transistor shown in FIG. 3D and FIG. 5D.

According to the present invention, because the isolation-side low concentration region 15 is provided between the channel stopper region 8 and the source region and the drain region (the high concentration regions 7 and the low concentration regions 6), it is possible to suppress degradation of the reverse characteristic of a pn-junction formed at the element-side end of the channel stopper region 8 in comparison with the conventional construction.

Figure 6A:
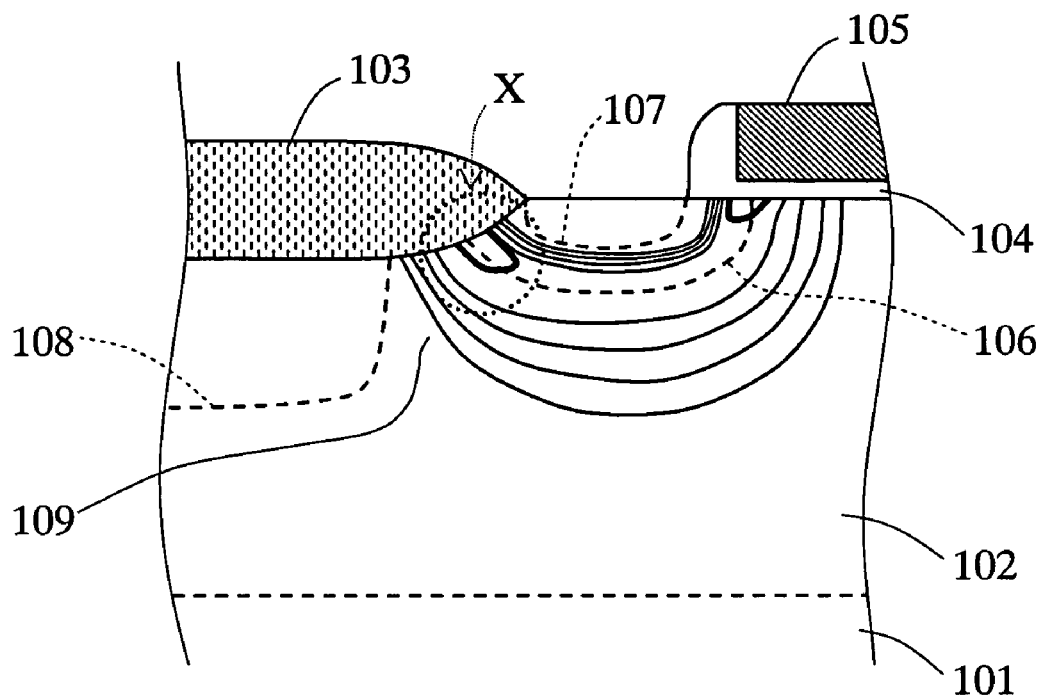
FIGS. 6A and 6B show the electric field distribution of a semiconductor device of the first embodiment of the present invention.
Figure 6B:
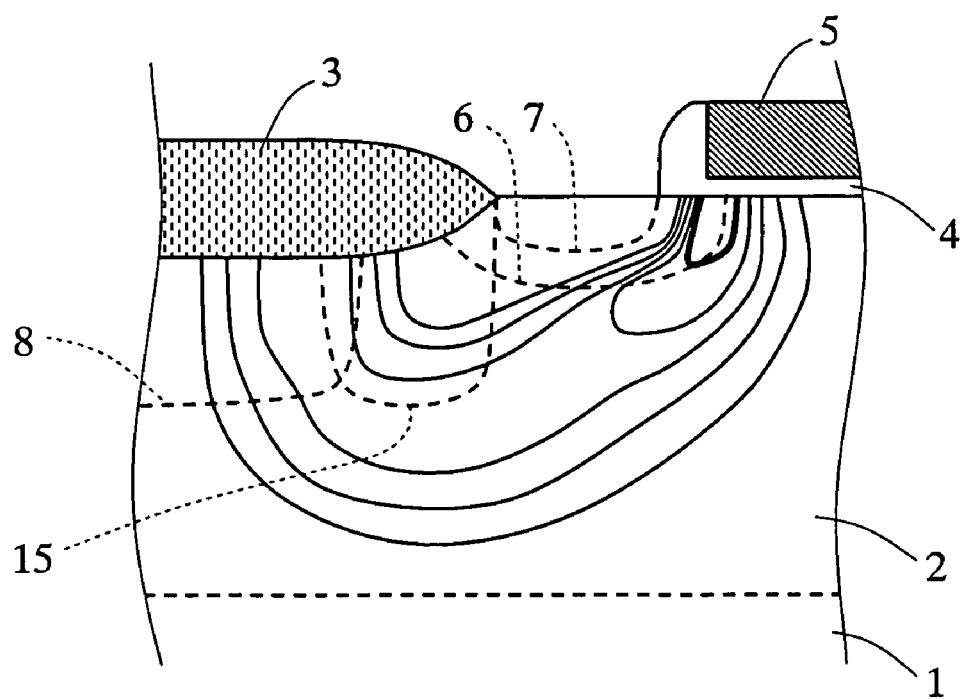

The electric field distribution in the pn-junction is shown in FIGS. 6A and 6B. FIG. 6A is an illustration showing the electric field distribution of a p-channel MOS transistor having the same structure as the conventional semiconductor device shown in FIGS. 11A to 11C, and FIG. 6B the electric field distribution of the semiconductor device of the present invention shown in FIGS. 1A to 1C.

The high concentration region 107 and the low concentration region 106 shown in FIG. 6A correspond to the drain region, showing a state where a drain voltage of −17 V is applied. Conversely, FIG. 6B is shown the state where a drain voltage of −20 V is applied to the drain region comprising the high concentration region 7 and the low concentration region 6. Also, the regions shown by the broken line in FIGS. 6A and 6B are the channel stopper region 8 (108), the low concentration region 6 (106), the high concentration region 7 (107), and the isolation-side low concentration region 15, which are put under the same condition for the formation except the isolation-side low concentration region. Furthermore, in FIGS. 6A and 6B, each equifield strength curve shown by the solid line in the impurity region indicates the same electric field strength. In this instance, the equifield strength curve for the highest electric field strength is shown by a thick line.

As is understood from FIG. 6A, in the conventional semiconductor device, a high electric field region (the section X shown in FIG. 6A) exists immediately below the field oxide film 103. That is to say, the region is provided with a state where a breakdown can easily occur. Conversely, in FIG. 6B, in spite of the fact that an electric potential that can generate a larger electric field than that in FIG. 6A is applied to the drain region, there is no high electric field region occurring immediately below the field oxide film 3, and a high electric field region is formed only at the drain end immediately below the gate electrode 5. That is to say, in the semiconductor device of the present invention, there is no unnecessary decrease in voltage resistance on the channel stopper 8 side, where the voltage resistance is restricted by the drain end of the channel region. While a structure with a spacer is provided on the side face of the gate electrode 5 in FIGS. 6A and 6B, both semiconductor devices have the same structure, and the structure does not influence the difference in the electric field distribution.

Thus, according to the present invention, when the channel stopper region 8 is formed with the same concentration as in a semiconductor device having a conventional offset structure, electric field concentration occurring at the pn-junction can be significantly reduced. Then, it is possible to form the channel stopper region 8 with a higher concentration than conventional ones.

In addition, as described above, if the field oxide film 3 is formed after forming the channel stopper region 8, with the growth of the field oxide film 3 toward the interior of the silicon substrate 1, a pile-up region having a relatively high concentration of impurity (phosphorus) is generated on the interface of the field oxide film 3 and the silicon substrate 1 by pile-up (segregation). However, in the semiconductor device of the present invention, because the isolation-side low concentration region 15 is provided, the low concentration region 6 is not directly contacted by such a pile-up region, and degradation of the reverse characteristic of the pn-junction due to the pile-up region can also be suppressed. Therefore, regardless of the surface concentration (impurity concentration) of the channel stopper region 8, it is possible to convert the low concentration region 6 into a high concentration, decrease the resistance (ON-resistance) of LDD portions of the source region and the drain region, and improve the current capacity of the transistor.

In the same way, in the semiconductor device of the present invention, because the isolation-side low concentration region 15 is provided, regardless of the impurity concentration of the low concentration region 6, it is possible to freely set the surface concentration (impurity concentration) of the channel stopper region 8. For example, from the standpoint of enhancing the voltage resistance of a pn-junction formed at the element-side end of the channel stopper region 8, it is desirable to form it setting the surface concentration of the channel stopper region 8 to be lower than the surface concentration of the isolation-side low concentration region 15. Also, when wires etc. are formed on the field oxide film 3 and an electric potential is charged, a parasitic MOS transistor is constructed wherein the field oxide film 3 functions as a gate insulating film. From the standpoint of raising the threshold voltage at which the parasitic MOS transistor becomes conductive, it may be formed setting the surface concentration of the channel stopper region 8 to be higher than the surface concentration of the isolation-side low concentration region 15.

Furthermore, in the present invention, because impurity introduction for forming the isolation-side low concentration region 15 is performed before forming the field oxide film 3, impurity concentration gradient between the isolation-side low concentration region 15 and the channel stopper region 8 becomes moderate by thermal processing at the time of forming the filed oxide film 3. Moreover, it becomes difficult for the reverse characteristic of the pn-junction to be degraded.

In the semiconductor device of this embodiment, immediately below the gate electrode 5, the channel stopper region 8 is formed projecting toward the element region 11 along the gate electrode 5, and its tip makes contact with the channel region 10. Therefore, immediately below the gate electrode 5, no reverse layer is formed in any region adjoining the channel region 10, and source-drain leakage can also be prevented.

As explained above, according to such construction of this embodiment, an MOS transistor having a high voltage resistance of 15 V or higher can be constructed compactly. Also, by changing the concentration and/or size of the isolation-side low concentration region 15, semiconductor devices having various voltage resistance values can be designed. Therefore, from the standpoint of the voltage surge protection, even when forming semiconductor devices having different voltage resistance values on the same substrate, it is possible to form a semiconductor device having a desired voltage resistance value.

Also, in the construction, because the source region and the drain region are formed symmetrically across the gate electrode, even when comprising a circuit by utilizing the symmetry of the electric characteristics of the source region and the drain region, the degree of freedom in laying out the semiconductor device is enhanced, making it possible to design circuits easily.

Figure 7A:
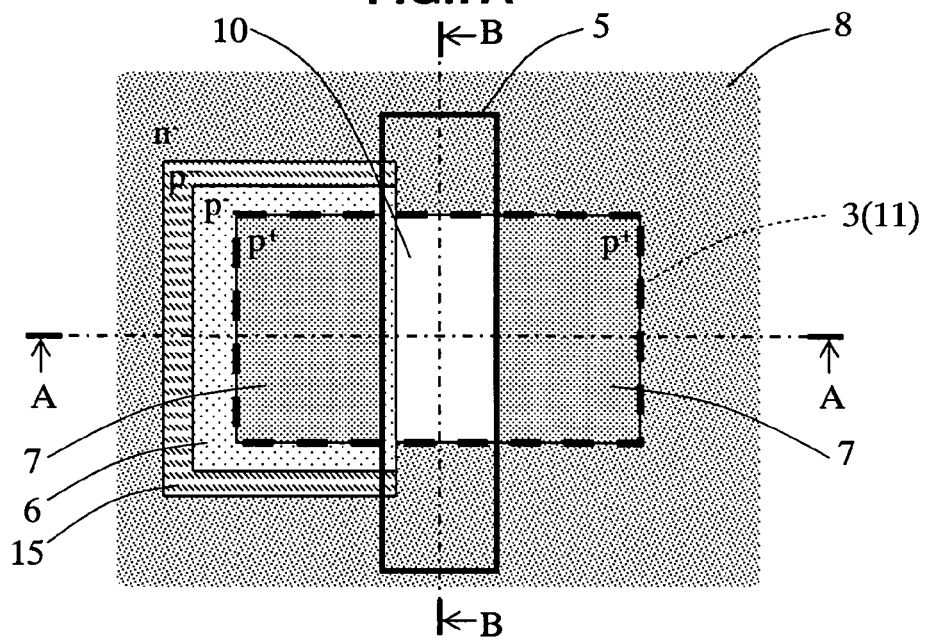
FIGS. 7A to 7C show the first modification example of a semiconductor device of the first embodiment of the present invention.
Figure 7B:
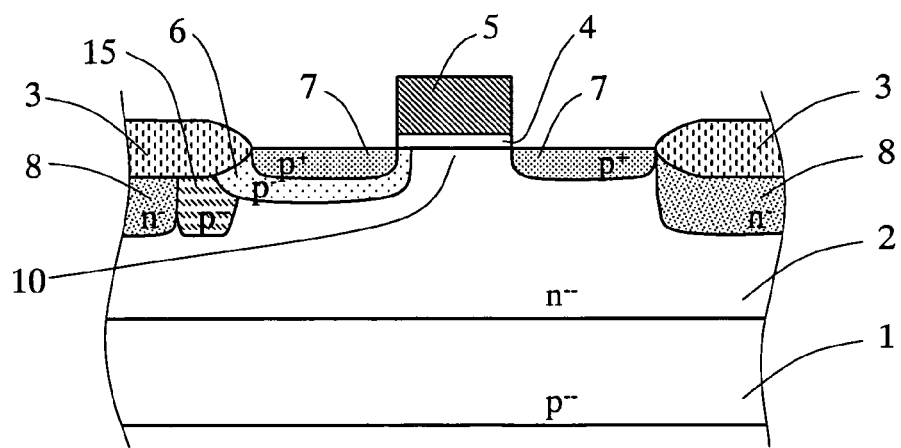
Figure 7C:
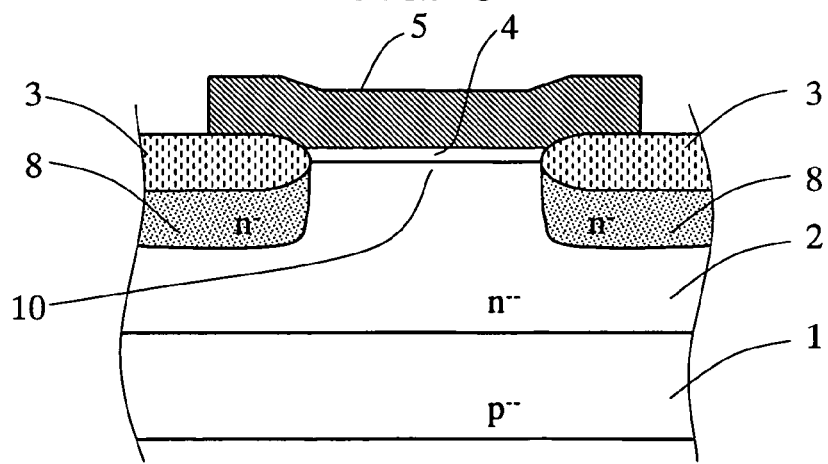

Also, while the above is provided with a structure wherein the low concentration region 6 and the low concentration region 15 are formed in each of the source region and the drain region, the present invention is not limited to such a structure. For example, as shown in FIGS. 7A to 7C, it may be constructed so that the low concentration region 6 and the isolation-side low concentration region 15 are formed only in one of the source region and the drain region (in general, the drain region where a voltage is applied for operating), and that the channel stopper region 8 is made contact them. In this case, in the processes shown in FIGS. 3C and 3D, and FIGS. 5C and 5D, non-formation region of the field oxide film 3 located in one side of the gate electrode 5 is masked with a resist.

Figure 8A:
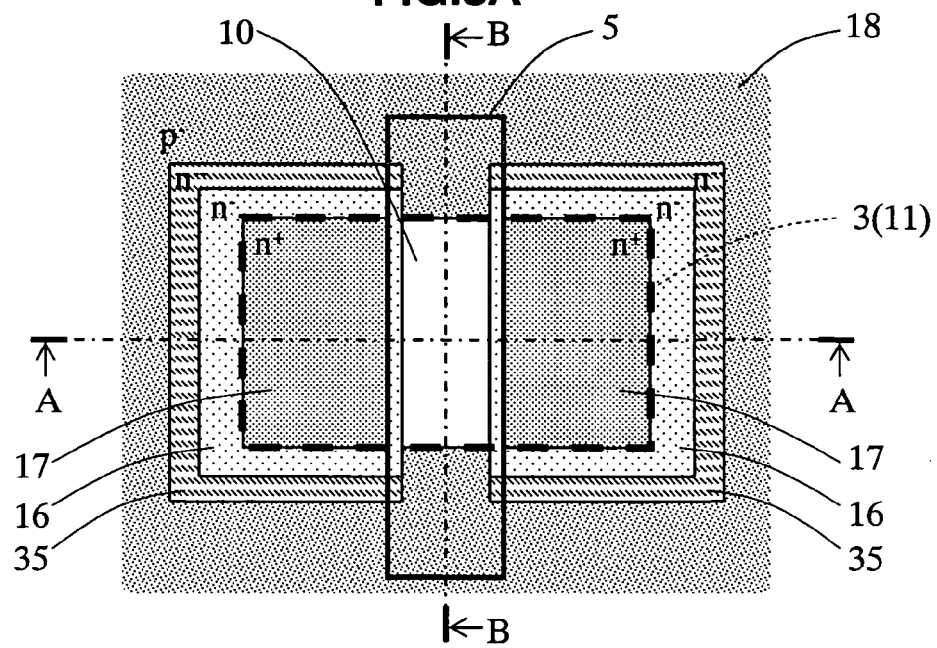
FIGS. 8A to 8C show the second modification example of a semiconductor device of the first embodiment of the present invention.
Figure 8B:
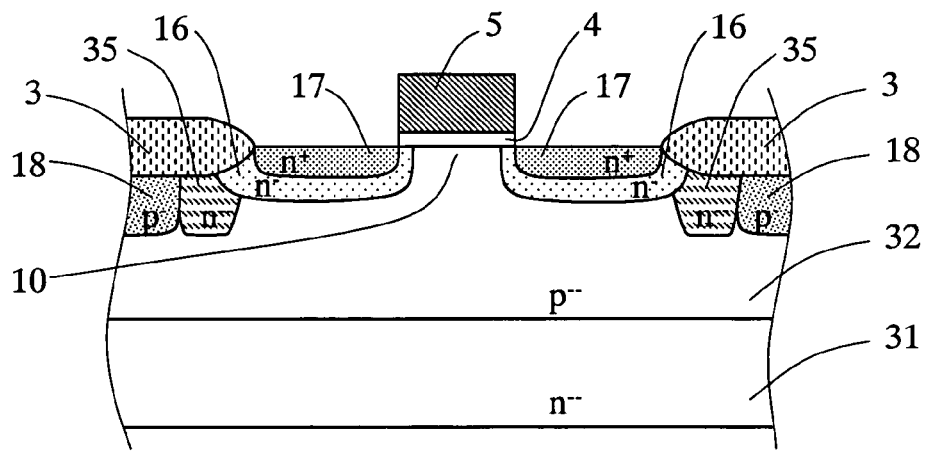
Figure 8C:
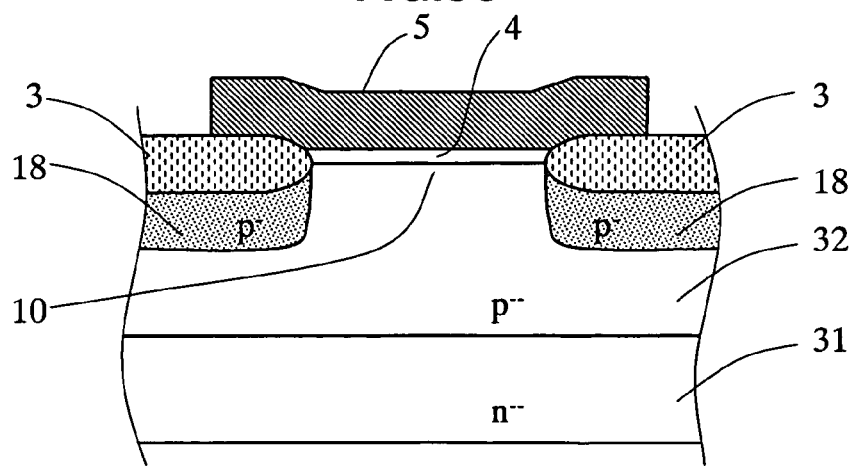
Figure 9A:
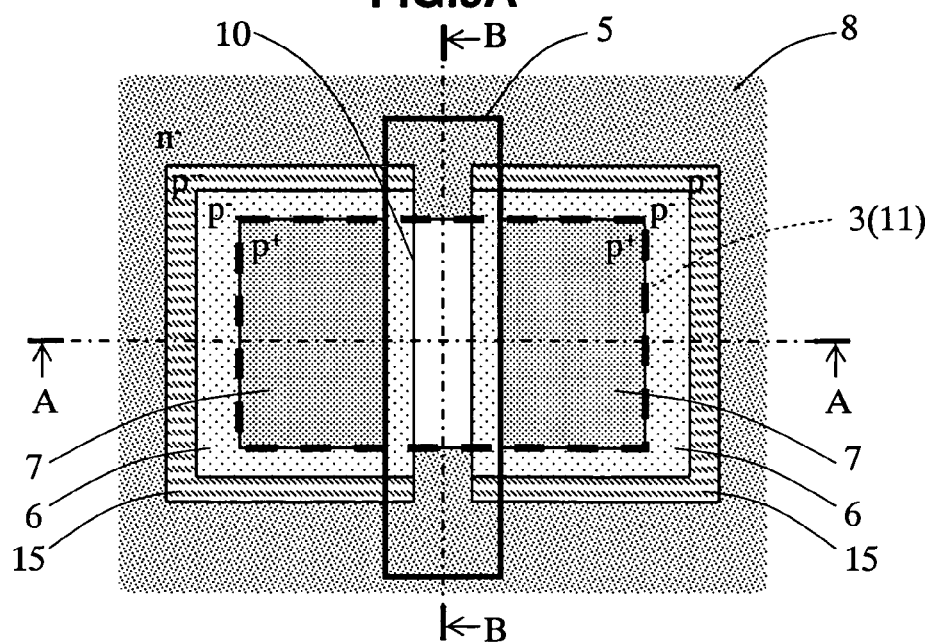
FIGS. 9A to 9C show the third modification example of a semiconductor device of the first embodiment of the present invention.
Figure 9B:
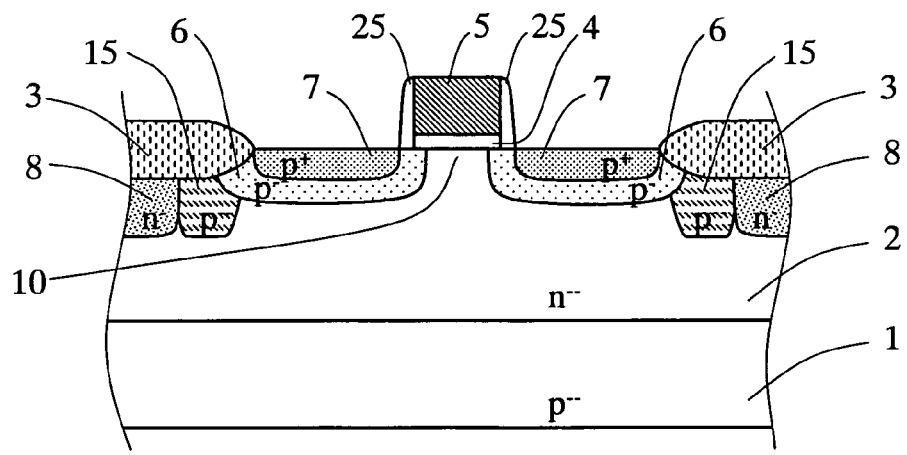
Figure 9C:
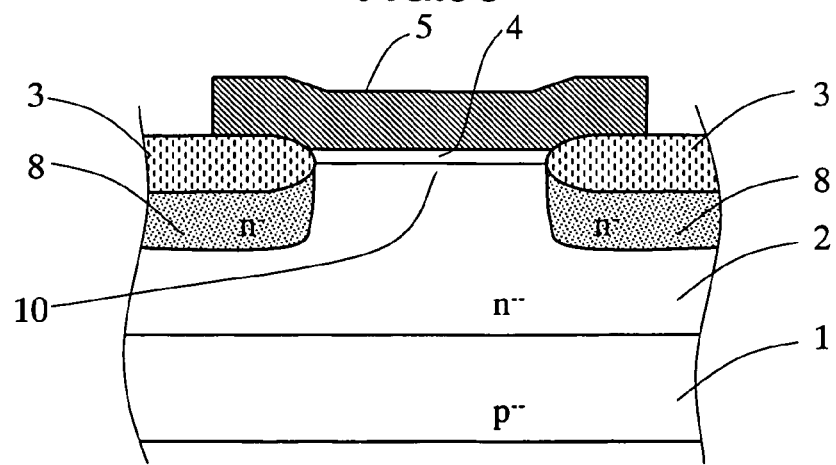

Also, while the above is a p-channel MOS transistor formed in an n-well constructed on a p-type silicon substrate, the same effect can also be achieved with a p-channel MOS transistor formed on an n-type silicon substrate. In addition, the present invention can be applied to an n-channel MOS transistor. In this case, as shown in FIGS. 8A to 8C, a source region and a drain region comprising an n-type high concentration region 17 and an n-type low concentration region 16 are formed on the surface portion of a p-well 32 provided on an n-type silicon substrate 31. Then, a p-type channel stopper 18 is provided below the field oxide film 3, and an n-type isolation-side low concentration region 35 is provided between the channel stopper 18 and the low concentration region 16.

Figure 3C:
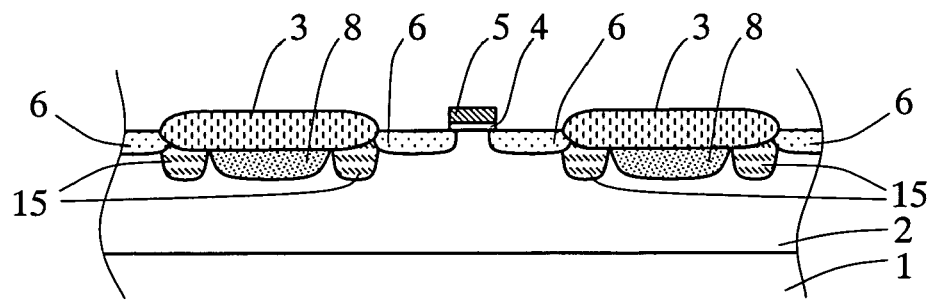
Figure 3D:
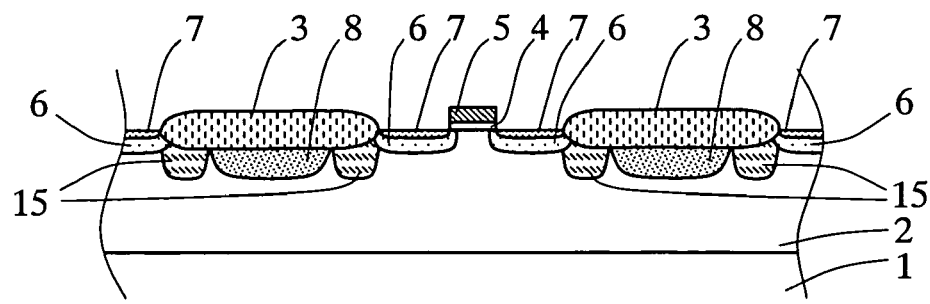
Figure 5C:
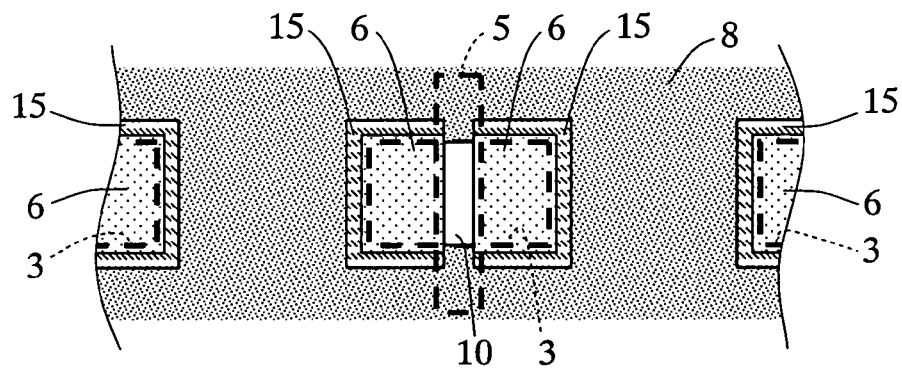
Figure 5D:
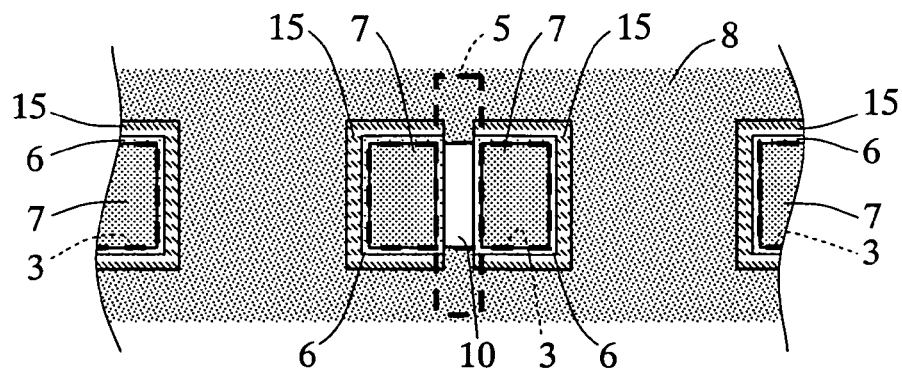

Furthermore, the present invention can be applied to MOS transistors of the general LDD structure provided with a spacer 25 on the side of the gate electrode 5 as shown in FIGS. 6A to 6B, and FIGS. 9A to 9C. As is well known, the spacer 25 can be formed by applying anisotropic dry etching such as RIE (Reactive Ion Etching) to a silicon oxide film formed on the surface of the gate electrode 5 by the CVD method in the perpendicular direction to the silicon substrate 1 surface when patterning of the gate electrode 5 and formation of the low concentration region 6 are complete (FIG. 3C and FIG. 5C). In this case, tilting of the silicon substrate 1 in the ion implantation process of the low concentration region 6 may be performed upon necessity. With this construction, it is also possible to perform salicide conversion which is effective for reducing gate resistance and contact resistance.

In addition, in each of the constructions, an offset region may be provided between the isolation-side low concentration region 15 and the channel stopper region 8 for further increasing the voltage resistance. Also, it is not indispensable to form the field oxide film 3 by the thermal oxidation method but can be formed by the CVD method.

Embodiment 2

Figure 10A:
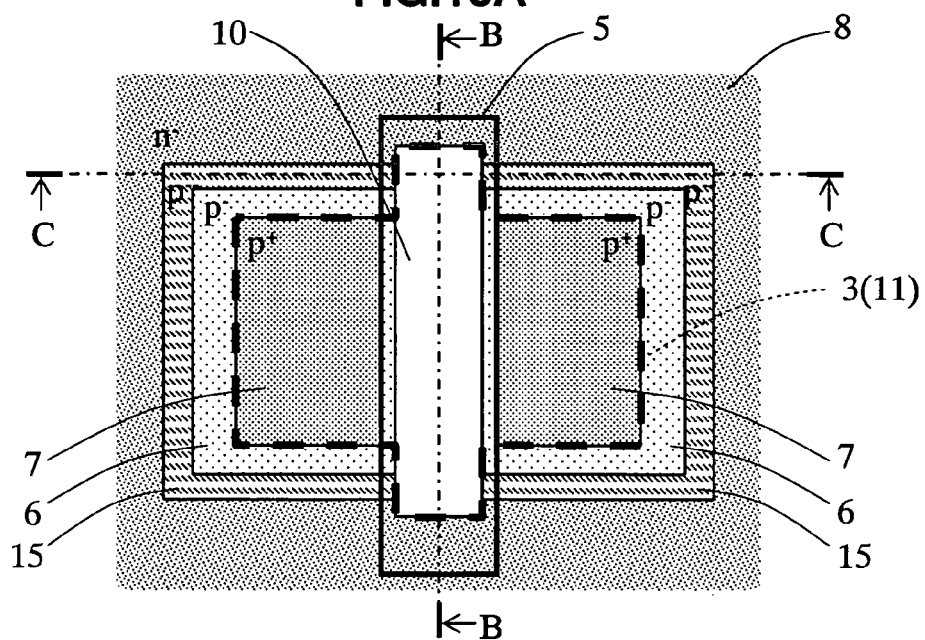
FIGS. 10A to 10C show a semiconductor device of the second embodiment of the present invention.
Figure 10B:
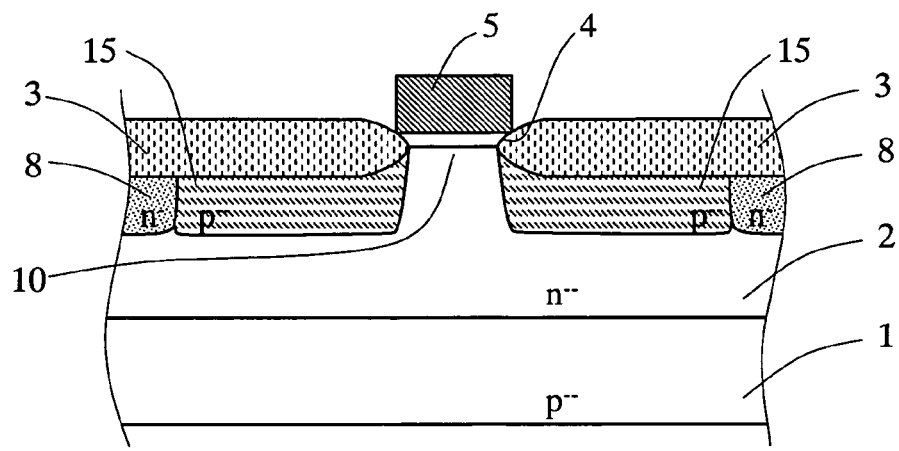

Next, a semiconductor device of an embodiment 2 of the present invention is explained in detail hereafter, with reference to the drawings. FIG. 10A is a plane layout diagram of the semiconductor device of this embodiment, and FIGS. 10B and C are cross-sectional views at the C-C line and the B-B line in FIG. 10A. The A-A cross-section in FIG. 10A is the same as the cross-sectional view shown in FIG. 1B. Also, FIGS. 10A to 10C illustrate a p-channel MOS transistor in the same way as in FIGS. 1A to 1C.

Figure 10C:
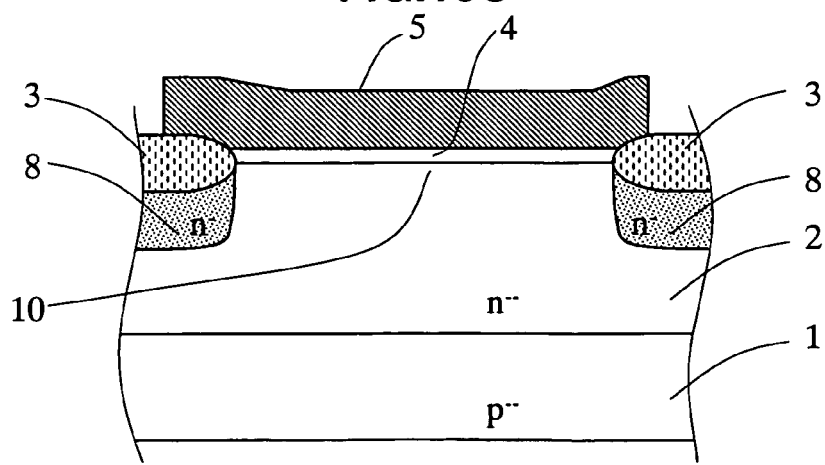

As shown in FIGS. 10A and 10C, the semiconductor device of this embodiment is different from the first embodiment in that in the region immediately below the gate electrode 5, the channel region 10 between the source region and the drain region projects along the gate electrode 5 toward the channel stopper region 8 (the channel stopper region 8 is retreated) and the channel region 10 is formed contacting the channel stopper region 8, and that the non-formation region 11 (a region shown by the broken line in FIG. 10A) of the field oxide film 3 immediately below the gate electrode 5 is provided in a state that it coincides with the shape of the projecting section of the channel region 10. Others are the same as in the embodiment 1.

Therefore, in the semiconductor device of this embodiment, the silicon oxide film 20 and the silicon nitride film 21 shown in FIG. 4A are formed in shapes coinciding with the shapes of the element region 11 in FIG. 10A in place of rectangular shapes.

According to the construction of this embodiment, in the same way as in the embodiment 1, mixed mounting with a low-voltage MOS transistor is possible. Also, according to this construction, because the isolation-side low concentration region is provided between the channel stopper region 8 and the source region and between the channel stopper region 8 and the drain region (the p-type high concentration region 7 and the p-type low concentration region 6), even if the channel stopper region 8 is formed with higher concentration, degradation of the reverse characteristic of the pn-junction is suppressed.

Moreover, because the channel region 10 projects outward toward the channel stopper region 8 and makes contact with the channel stopper region 8 and the isolation-side low concentration region 15 immediately below the gate electrode 5, no reverse phenomenon occurs in a semiconductor layer adjoining the channel region 10 immediately below the gate electrode 5, and source-drain leakage can be prevented.

Therefore, according to the construction of this embodiment, an MOS transistor having a high voltage resistance of 15 V or higher can be constructed compactly. Also, by changing the concentration and/or size of the isolation-side low concentration region 15, designs having various voltage resistance values are possible.

While the above is provided with a structure wherein the low concentration region 6 and the low concentration region 15 are formed in each of the source region and the drain region, it may be provided with construction in which the low concentration region 6 and the isolation-side low concentration region 15 are formed in only one of the source region and the drain region which the channel stopper region 8 makes contact with these in the same way as in the embodiment 1.

Also, the construction of this embodiment can also be applied to a p-channel MOS transistor and an n-channel MOS transistor formed on a p-type silicon substrate in the same way as in the embodiment 1.

Moreover, the construction of this embodiment can also be applied to MOS transistors of the general LDD structure provided with a spacer on the side of the gate electrode 5. Also, salicide conversion can be performed which is effective for reducing gate resistance and contact resistance.

In addition, in each of the constructions, an offset region may be provided between the isolation-side low concentration region 15 and the channel stopper region 8 for further enhancing the voltage resistance. Also, forming the field oxide film 3 by the thermal oxidation method is not indispensable, but it may be formed by the CVD method.

Needless to say the semiconductor device fabrication process illustrated in each of the embodiments may be replaced with a publicly-known, equivalent process.

The present invention is useful as a semiconductor device which is compact, is provided with a high voltage resistance suitable for simultaneous formation with a low-voltage MOS transistor, and suppresses source-drain leak, and as manufacturing method thereof.

Further, it is possible to apply various design changes in the range of the subject matter described in the scope of claim for patent.

While the invention has been shown and described in detail, the foregoing description is in all aspects illustrative and not restrictive. It is therefore understood that numerous modifications and variations can be devised without departing from the scope of the invention.

The invention claimed is:

1. A semiconductor device comprising:
   a semiconductor layer of a first conduction type;
   a source region and a drain region of a second conduction type formed apart from each other by a specified interval at the surface portion of an element region sectioned by an element isolation film formed on the semiconductor layer;
   a gate electrode formed on a gate insulating film on the semiconductor layer between the source region and drain region;
   a channel stopper region of the first conduction type formed below the element isolation film; and
   at least one of the source region and drain region having a high concentration impurity region of the second conduction type and a low concentration impurity region of the second conduction type provided so as to surround the high concentration impurity region and to extend below the element isolation film;
   wherein the bottom of a portion of the low concentration impurity region below the element isolation film is positioned deeper than the bottom of a portion of the low concentration impurity region not covered by the element isolation film.

2. The semiconductor device according to claim 1, wherein a channel region consisting of the semiconductor layer immediately below the gate electrode has a projecting section protruding from between the source region and drain region toward the channel stopper region in plain view, and the projecting section and the channel stopper region are in contact with each other.

3. The semiconductor device according to claim 1, wherein, in an area below the gate electrode, the channel stopper region has a projecting section protruding from a portion below the element isolation film toward a channel region consisting of the semiconductor layer immediately below the gate electrode in plain view, and the projecting section and the channel region are in contact with each other.

4. The semiconductor device according to claim 1, wherein the surface impurity concentration of the portion of the low concentration impurity region below the element isolation film is lower than the surface impurity concentration of the portion of the low concentration impurity region not covered by the element isolation film.

5. The semiconductor device according to claim 2, wherein the surface impurity concentration of the portion of the low concentration impurity region below the element isolation film is lower than the surface impurity concentration of the portion of the low concentration impurity region not covered by the element isolation film.

6. The semiconductor device according to claim 3, wherein the surface impurity concentration of the portion of the low concentration impurity region below the element isolation film is lower than the surface impurity concentration of the portion of the low concentration impurity region not covered the element isolation film.

7. The semiconductor device according to claim 4, wherein the surface impurity concentration of the channel stopper region is lower than the surface impurity concentration of the portion of the low concentration impurity region below the element isolation film.

8. The semiconductor device according to claim 5, wherein the surface impurity concentration of the channel stopper region is lower than the surface impurity concentration of the portion of the low concentration impurity region below the element isolation film.

9. The semiconductor device according to claim 6, wherein the surface impurity concentration of the channel stopper region is lower than the surface impurity concentration of the portion of the low concentration impurity region below the element isolation film.

10. The semiconductor device according to claim 4, wherein the surface impurity concentration of the channel stopper region is higher than the surface impurity concentration of the portion of the low concentration impurity region below the element isolation film.

11. The semiconductor device according to claim 5, wherein the surface impurity concentration of the channel stopper region is higher than the surface impurity concentration of the portion of the low concentration impurity region below the element isolation film.

12. The semiconductor device according to claim 6, wherein the surface impurity concentration of the channel stopper region is higher than the surface impurity concentration of the portion of the low concentration impurity region below the element isolation film.

13. The semiconductor device according to claim 1, wherein the channel stopper region is located spatially apart from the low concentration impurity region.

14. The semiconductor device according to claim 2, wherein the channel stopper region is located spatially apart from the low concentration impurity region.

15. The semiconductor device according to claim 3, wherein the channel stopper region is located spatially apart from the low concentration impurity region.

16. The semiconductor device according to claim 4, wherein the channel stopper region is located spatially apart from the low concentration impurity region.

17. The semiconductor device according to claim 5, wherein the channel stopper region is located spatially apart from the low concentration impurity region.

18. The semiconductor device according to claim 6, wherein the channel stopper region is located spatially apart from the low concentration impurity region.

* * * * *